TEMPERATURE COMPENSATION OF ELECTRICAL DEVICES

Filed Nov. 21, 1966

INVENTORS
JAMES E. TREATCH
GERALD C. VON SCHWEDLER
BY Mueller, Aichele & Rauner
ATTORNEYS United States Patent Office 3,437,849
Patented Apr. 8, 1969

3,437,849

TEMPERATURE COMPENSATION OF ELECTRICAL DEVICES

James E. Treatch, Chicago, and Gerald C. von Schwedler, Schiller Park, Ill., assignors to Motorola, Inc., Franklin Park, Ill., a corporation of Illinois Filed Nov. 21, 1966, Ser. No. 595,964
Int. Cl. H02n 11/00; H03b 5/30
U.S. Cl. 310—8.9 6 Claims This application pertains to temperature compensation of electrical devices and more particularly to frequency temperature compensation of electromechanical resonating devices.

During the past few years, especially since the advent of the space age there has been an increasing emphasis on miniaturization within the electronics industry. Piezoelectric resonating devices have not escaped this trend, however, conventional methods used for frequency temperature compensating these devices such as ovens have become inadequate. Although the resonating devices have been miniaturized, when combined with the standard temperature compensating device, the resulting package is too large for many applications.

It is an object of this invention to provide improved means for temperature compensating electrical devices.

It is another object of this invention to provide an improved method for frequency temperature compensating an electromechanical resonating device which does not add to the size of the device.

It is a further object of this invention to provide an improved piezoelectric ceramic resonating device that is frequency temperature compensated over a wide range of temperatures.

A feature of this invention is a process for temperature compensating an electrical device wherein a ceramic material is selected having a predetermined thermoelastic coefficient, a metal is cold worked a predetermined percentage and subsequently heat treated to exhibit a thermoelastic coefficient equal in magnitude but opposite in sign to the thermoelastic coefficient of the metal, the metal is formed into a substrate and the ceramic is fixed thereto.

Another feature of the invention is a process for temperature compensating an electrical device wherein the ceramic material is piezoelectric, and the metal substrate is a mechanical resonator. The ceramic is flame sprayed on the resonator, and the metal resonator and piezoelectric ceramic have frequency temperature coefficients that are equal in magnitude but opposite in sign so that they combine to provide frequency temperature compensation of the device.

A further feature of this invention is an electromechanical frequency selector having a piezoelectric ceramic flame sprayed on a metal resonator, wherein a strain sensitive semiconductor member is fixed on the opposite side of the resonator from the ceramic. A constant current source and load resistor are coupled in series with the semiconductor member so that with an alternating current being applied to the piezoelectric ceramic, the ceramic drives the resonator to vibrate at the resonant frequency thereof thereby applying a varying strain on the semiconductor member which acts to vary the potential across the load resistor.

Figures 1, 2:
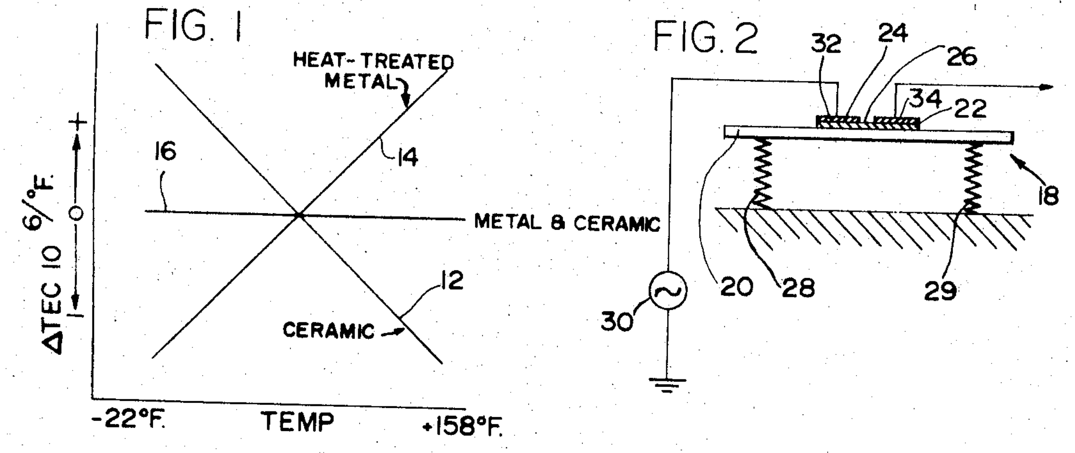
FIG. 1 is a graph illustrating the frequency temperature compensating principle of this invention.
FIG. 2 is a side elevation view of a device made in accordance with this invention.

In one embodiment of this invention, a piezoelectric ceramic material is selected that has a predetermined frequency temperature coefficient. Subsequently a metal alloy is cold worked to a predetermined percentage and heat treated until it exhibits a frequency temperature coefficient that is equal in magnitude but opposite in sign to the frequency temperature coefficient of the ceramic. The metal is formed into a mechanical resonator, and the ceramic is flame sprayed onto the metal. A silver electrode is deposited on one side of the ceramic. The electrode is scribed to provide individual input and output electrodes. The piezoelectric ceramic is responsive to an AC potential applied to the input electrode to drive the mechanical resonator at its resonant frequency. The vibrations of the resonator in turn drive the piezoelectric ceramic so that an electrical signal at the resonant frequency of the mechanical resonator is coupled from the output electrode of the ceramic. Should the temperature of the device vary during operation, the equal but opposite frequency temperature coefficients of the ceramic and the metal combine so that the device exhibits an overall low frequency temperature coefficient that approaches zero. In this manner, the desired output frequency is maintained free of any variations caused by temperature changes.

In the past, the frequency of a mechanical resonator was generally changed by varying the physical length of the device. Therefore, the important factor in frequency temperature compensating these devices was to control the coefficient of thermo expansion, which can be defined as the change in unit length proportional to the change in temperature. However, when making resonators by firing piezoelectric ceramic materials to metal substrates, which act as mechanical resonators, such as by flame spraying, gold bonding, electrostatics or other known processes, the properties of the ceramic on metal is such that one concerned with frequency temperature compensation should seek a zero frequency temperature coefficient for the device. The frequency temperature coefficient is defined as the change in frequency with the change in temperature.

The frequency for the metal ceramic, or a device combining them both can be defined by the following formula.

$$f=\frac{kt}{l^2\sqrt{\frac{E}{P}}}$$

where:

$t$=thickness
$l$=length
E=Youngs Modulus
P=density

Only the value of $k$ is changed in the formula in determining the frequency of the different materials.

It has been found that of all the variables in the formula that change with temperature, the change in Youngs Modulus with change in temperature for the ceramic material has the most pronounced effect on the frequency temperature cofficient of a device where the ceramic and metal is combined. Youngs Modulus is defined as the ratio of unit stress to unit deformation. The change in Youngs Modulus with change in temperature is known as the thermoelastic coefficient. Therefore, another way to state the above would be to say that the change in the thermoelastic coefficient of ceramic has the greatest effect on the frequency temperature coefficient of the combined piezoelectric ceramic and metal mechanical resonator devices.

The process for frequency temperature compensating a resonating device formed by fixing a piezoelectric ceramic on a metal substrate may be understood by referring to FIG. 1 Initially, a piezoelectric ceramic is selected which has a known frequency temperature coefficient. A metal is selected for the mechanical resonating member which has a controllable thermoelastic coefficient and coefficient of thermo expansion, hence a controllable frequency temperature coefficient. One such metal which has been used with success is NI-Span-C Iron, Nickel, Chromium and Titanium alloy 902 made by the Huntington Alloy Products Division of the International Nickel Company. NI-Span-C has a low coefficient of thermo expansion so that the main concern in controlling the frequency temperature coefficient of the metal is controlling the thermoelastic coefficient.

The thermoelastic coefficient of NI-Span-C can be controlled by cold working and heat treating. In one example the alloy was cold worked to a percentage of about 20% and heat treated at 1200° F. for five hours. When removed from the oven and tested, the metal exhibited a positive thermoelastic coefficient, and because the thermoelastic coefficient in this instance determines the frequency temperature coefficient (this is because the coefficient of thermo expansion is low) it also exhibits a positive frequency temperature coefficient.

By referring to FIG. 1, the relation between the thermoelastic coefficient of the ceramic and the thermoelastic coefficient of the cold worked and heat treated metal can be seen. Line 12 of the graph indicates that the ceramic has a predetermined negative thermoelastic coefficient when fixed to the metal. Line 14 on the graph illustrates that after being cold worked and heat treated the NI-Span-C metal had a positive thermoelastic coefficient. The slopes of the lines are equal indicating that the thermoelastic coefficient of the ceramic and heat treated metal are equal in magnitude but opposite in sign. Line 16 shows that the combination of the ceramic on the metal for a wide temperature range results in a zero thermoelastic coefficient with the positive and negative coefficients effectively controlling each other so that the device exhibits an overall low temperature coefficient that approaches zero.

After the metal is cold worked and heat treated, it is formed into the desired shape of the resonating device and the ceramic powder is then flame sprayed onto the metal for instance, in the form of a disc. Silver is then plated or flame sprayed on the ceramic material to form an electrode for the piezoelectric ceramic. Because the temperature compensation is accomplished by using the physical properties of the metal and ceramic, no external devices such as ovens are needed to provid a constant temperature, therefore, the size of the package of the device using this method of temperature compensation is determined only by the size of the devices themselves.

A simple resonating device incorporating the frequency temperature compensating principles of this invention is shown in FIG. 2. The resonator 18 includes a free-free bar mechanical resonator 20 of NI-Span-C or similar metal which has fixed thereon by flame spraying or other method a piezoelectric ceramic layer 22. Deposited on one side the piezoelectric layer 22 is an electrode 24 of a good conducting material such as silver. The electrode 24 has been severed by scribing at 26 to provide for individual input and output electrodes on the ceramic layer 22. Springs 28 and 29 support the free bar resonator 20 at the nodal points of the resonator so that the device is relatively immune from external vibrations.

In operation, an alternating current source 30 applies an alternating current to input electrode 32 causing the piezoelectric ceramic 22 to vibrate to drive the mechanical free-free bar resonator 20 at its resonant frequency. An output at the resonant frequency of the bar 20 is coupled from output electrode 34. By using the single electrode 24 which is scratched or scribed to form the two electrodes 32 and 34, the device is easier to assemble. As was explained previously, the frequency coefficient of the ceramic 22 was known, and the metal in the free bar resonator 20 was cold worked and heat treated so that its thermoelastic coefficient was equal in magnitude to the thermoelastic coefficient of the ceramic 22 but opposite in sign. Therefore, for temperature variations in the resonating device 18, the two thermoelastic coefficients combine to cancel each other to give the device a resulting low frequency temperatue coefficient, approaching zero and hence an accurate output frequency at the resonant frequency of the mechanical resonator 20.

Figure 3:
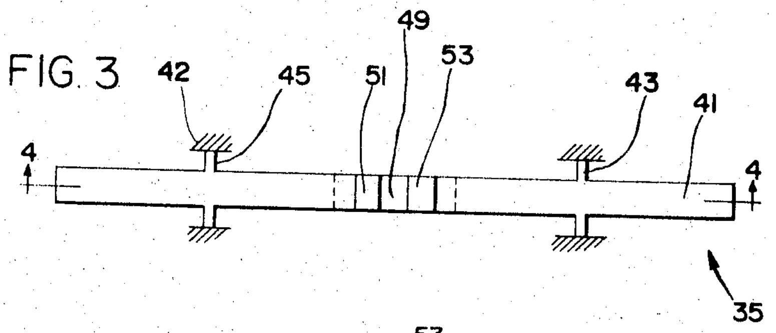
FIG. 3 is a top plan view of another device made in accordance with the principles of this invention.
Figure 4:
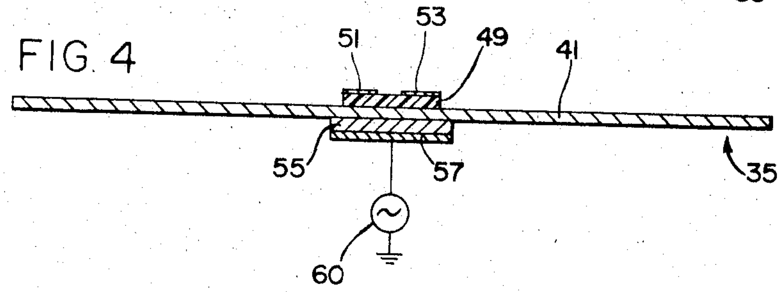
FIG. 4 is a cross-section taken along the lines 4—4 of FIG. 3.
Figure 5:
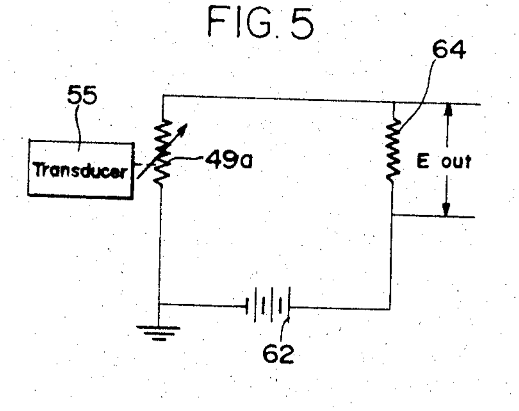
FIG. 5 is a combined block and schematic diagram illustrating the operation of the device of FIG. 3.

FIGS. 3, 4 and 5 indicate a frequency selector 35 which incorporates the frequency temperature compensation of this invention. Essentially, the frequency selector 35 includes an elongated mechanical resonator member 41. Leaf springs such as at 43 and 45 are integral with resonator 41 and are secured by appropriate means such as shown at 42 to provide a resilient or spring-like support. The springs are coupled to the resonator 41 at the nodal points of the resonator so that the resonator will be relatively free of external vibrations.

Mounted to the resonator member 41 is a piezoresistive semiconductor 49. This could be, for instance, a germanium or silicon semiconductor. The base material in a piezoresistive semiconductor is sensitive to strain so that any change in the strain of the base will result in the semiconductor becoming more or less resistive depending on the amount of strain. Piezoresistive semiconductor 49 has an emitter electrode 51 and collector electrode 53. A ceramic layer 55 is deposited by flame spraying or other method on the side of the resonator 41 opposite the semiconductor 49. An electrode of silver or other conducting material is then plated or sprayed onto the ceramic as shown at 57, and an alternating current source 60 is coupled to the electrode.

In operation, when an alternating current is placed on the ceramic 55, it will vibrate driving the resonator 41 to vibrate at its resonant frequency. These mechanical vibrations will alternately decrease and increase the strain on the base of the transistor 49.

A practical circuit using this device is shown in FIG. 5. A constant voltage source 62 and a load resistor 64 are coupled in series with the semiconductor 49 which is shown schematically in FIG. 5 as a variable resistor 49a. As the resonator 41 applies a varying strain to the base of transistor 49, the resistance of the transistor 49 in series with the load resistor 64 changes to vary the output potential across the resistor 64 to provide an output at the resonant frequency of the mechanical resonator member 41. Because the semiconductor 49 is an active part of the circuit, however, it acts as an amplifier to increase the output signal. Thus, the small drive from the piezoelectric transducer can be amplified to provide a low impedance output signal.

The frequency selector 35 is frequency temperature compensated in the manner previously described by selecting a piezoelectric ceramic 55 having a known negative frequency temperature coefficient and depositing the ceramic on the metal substrate 41 which exhibits a positive frequency temperature coefficient. With changes in temperature the positive and negative frequency coefficients combine to cancel each other so that the frequency selector 35 exhibits an overall low frequency temperature coefficient approaching zero.

What has been described, therefore, is an improved method for frequency temperature compensating electromechanical resonating devices, that does not add to the size of the device, and improved piezoelectric ceramic resonating devices that are temperature compensated over a wide range of temperatures.

We claim:

1. A temperature compensated electromechanical resonating device including in combination, a metal resonator having a controllable frequency temperature coefficient, a piezoelectric ceramic layer fixed to said metal resonator, said ceramic layer having a predetermined frequency temperature coefficient, said frequency coefficient of said metal substrate being equal in magnitude but opposite in sign to said frequency coefficient of said ceramic layer, so that under changing temperature conditions said frequency temperature coefficient of said metal substrate and said frequency temperature coefficient of said piezoelectric ceramic layer combine to maintain a low frequency temperature coefficient for the electromechanical resonating device.

2. The temperature compensated electromechanical resonating device of claim 1 wherein said resonator is made from a metal alloy having a controllable thermoelastic coefficient and said piezoelectric ceramic is flame sprayed on said resonator.

3. The temperature compensated electromechanical resonating device of claim 1 further including said piezoelectric ceramic having input and output electrodes deposited thereon, spring means supporting said metal resonator at the nodal points thereof to provide a free-free bar resonator, an alternating current source coupled to said input electrode, said current source exciting said resonating bar to provide an electrical signal at the resonating frequency of said bar at said output electrode.

4. An electromechanical frequency selector including in combination, a resonator member, spring means integral with said member and supporting the same at the nodal points thereof, strain sensitive semiconductor means coupled to one side of said resonator, a piezoelectric transducer fixed to said resonator on the side of said resonator opposite said semiconductor means, means for temperature stabilizing said frequency selector, and means coupled to said ceramic transducer to drive the same to drive said resonator at the resonant frequency thereof, with said semiconductor means being responsive to the vibration of said resonator to provide a low impedance output signal.

5. The electromechanical frequency selector of claim 4 wherein said piezoelectric ceramic is flame sprayed on said resonator member, and said means for temperature stabilizing said signal selector means includes said piezoelectric ceramic having a predetermined frequency coefficient, and said resonator having a frequency coefficient equal in magnitude but opposite in sign to the frequency coefficient of said piezoelectric ceramic, so that with temperature variation of the frequency selector the frequency coefficients of said resonator and said ceramic combine to result in a low frequency coefficient that approaches zero for the signal selector.

6. The electromechanical frequency selector of claim 4 further including a constant voltage source and a load resistor series coupled to said semiconductor means, and wherein said semiconductor means includes a piezoresistive semiconductor having a resistance varying in response to a mechanical strain applied thereto, said resonator applying mechanical strain to said semiconductor thereby varying the resistance coupled to the load resistor to provide a low impedance output signal at the frequency of said resonator.

References Cited

UNITED STATES PATENTS

| | | | |
|---|---|---|---|
| 2,695,357 | 11/1954 | Donley | 310—8.2 |
| 2,760,168 | 8/1956 | Doelz | 333—71 |
| 2,589,983 | 3/1952 | Blodgett | 310—8.5 |
| 3,114,848 | 12/1963 | Kritz | 310—8.3 |
| 3,069,572 | 12/1962 | Dick | 310—8.2 |
| 3,264,585 | 8/1966 | Poschenrieder | 333—72 |
| 3,281,725 | 10/1966 | Albsmeier | 310—8.2 |
| 3,311,760 | 3/1967 | Dorgin | 310—8.3 |
| 3,322,981 | 5/1967 | Brenig | 310—8.9 |
| 3,378,792 | 4/1968 | Holton | 333—30 |

J D MILLER, *Primary Examiner.*

U.S. Cl. X.R.

310—8.1; 331—155; 333—71, 72